United States Patent
Crescenzi, Jr.

(10) Patent No.: US 6,822,321 B2
(45) Date of Patent: Nov. 23, 2004

(54) PACKAGED RF POWER TRANSISTOR HAVING RF BYPASSING/OUTPUT MATCHING NETWORK

(75) Inventor: Emil James Crescenzi, Jr., Cambria, CA (US)

(73) Assignee: CREE Microwave, Inc., Sunnyvale, CA (US)

( * ) Notice: Subject to any disclaimer, the term of this patent is extended or adjusted under 35 U.S.C. 154(b) by 51 days.

(21) Appl. No.: 10/262,217

(22) Filed: Sep. 30, 2002

(65) Prior Publication Data
US 2004/0061214 A1 Apr. 1, 2004

(51) Int. Cl.⁷ ............................................. H01L 23/52
(52) U.S. Cl. ....................... 257/691; 438/106; 361/777
(58) Field of Search ................................ 257/691, 690, 257/578, 584; 438/106, 121; 333/247; 361/777, 778, 779

(56) References Cited

U.S. PATENT DOCUMENTS

| | | | |
|---|---|---|---|
| 5,272,450 A | | 12/1993 | Wisherd |
| 5,309,014 A | * | 5/1994 | Wilson ........................ 257/584 |
| 5,752,182 A | * | 5/1998 | Nakatsuka et al. ......... 455/333 |

* cited by examiner

Primary Examiner—Roy Potter
(74) Attorney, Agent, or Firm—Beyer Weaver & Thomas LLP

(57) ABSTRACT

The linearity of a wideband RF power transistor amplifier is improved by including output matching circuit and an integrated bias/RF diplexer with RF and video bypassing capacitor network within the transistor package and connected directly to the transistor. By placing the RF and video bypass power supply circuitry within the package and close to the transistor, the input impedance resonance can be increased from approximately 50 MHz to over 125 MHz, thereby reducing AM/PM distortion in the output signal.

19 Claims, 8 Drawing Sheets

US 6,822,321 B2

PACKAGED RF POWER TRANSISTOR HAVING RF BYPASSING/OUTPUT MATCHING NETWORK

BACKGROUND OF THE INVENTION

This invention relates generally to RF power transistors, and more particularly the invention relates to combining output matching and RF and video bypass circuitry in a packaged RF power transistor.

RF power transistors providing 10 watts or more of power are typically packaged as a discrete device, as shown generally at 10 in FIG. 1A and schematically in FIG. 1B. The packaged transistor (FET or bipolar) normally includes an input matching circuit 12 connecting input lead 14 to a gate of a FET (or base of a bipolar transistor) and an output matching circuit 16 connecting output lead 18 to the drain of a FET (or collector or emitter of a bipolar transistor). Normally the source of the FET is grounded.

The packaged transistor is typically mounted on a printed circuit board 20 as shown in FIG. 2. Also mounted on the printed circuit board are matching circuits 22, 24 and a bias/RF diplexer 26 which connect the transistor output to an RF output. A DC power supply is connected to the transistor output lead through a bias line RF and video bypass circuit 28, diplexer 26, and matching circuit 22. This dual function of the printed circuit board circuitry presents a desired impedance transformation at the carrier frequency, and provides a means of injection of DC bias current to the device through the diplexer. The circuitry must also properly bypass the power supply connection at RF and video frequencies. The distance of the circuitry from the packaged transistor is a limitation in this conventional approach. This separation introduces significant electrical delay, and the inherent characteristics of capacitors used in printed circuit board circuits causes an unavoidable limitation in bias circuit video bandwidth.

BRIEF SUMMARY OF THE INVENTION

In accordance with the invention, the output matching circuit and diplexer along with the RF and video bypassing network are integrated with the power transistor within the transistor package. This places the circuitry closer to the transistor and increases the power supply bypassing video bandwith. Further, the linearity (fidelity) of the power transistor circuit is improved relative to conventional devices for wideband signals.

In implementing the invention, discrete multilayer capacitors of the RF and video bypassing network can be connected in parallel with a capacitor (with optimal properties at the carrier frequency) of the output matching circuit in an integral arrangement with wire bonding providing inductive elements of the circuitry. Typically a wirebond is set to provide a shunt inductive reactance that is equal and opposite to the reactance of the transistor parasitic output capacitance. Additional capacitance for the RF output can be provided also with the RF output providing a bias input or functioning with a separate bias input.

The invention and objects and features thereof will be more readily apparent from the following detailed description and dependent claims when taken with the drawings.

DETAILED DESCRIPTION OF THE INVENTION

Figure 1A:
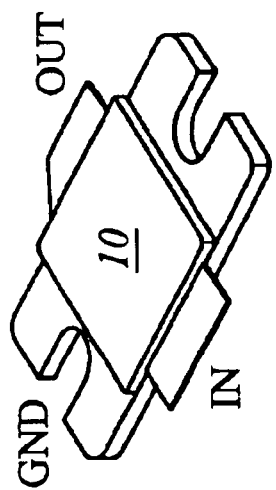
FIG. 1A is a perspective view of a packaged RF power transistor.
Figure 1B:
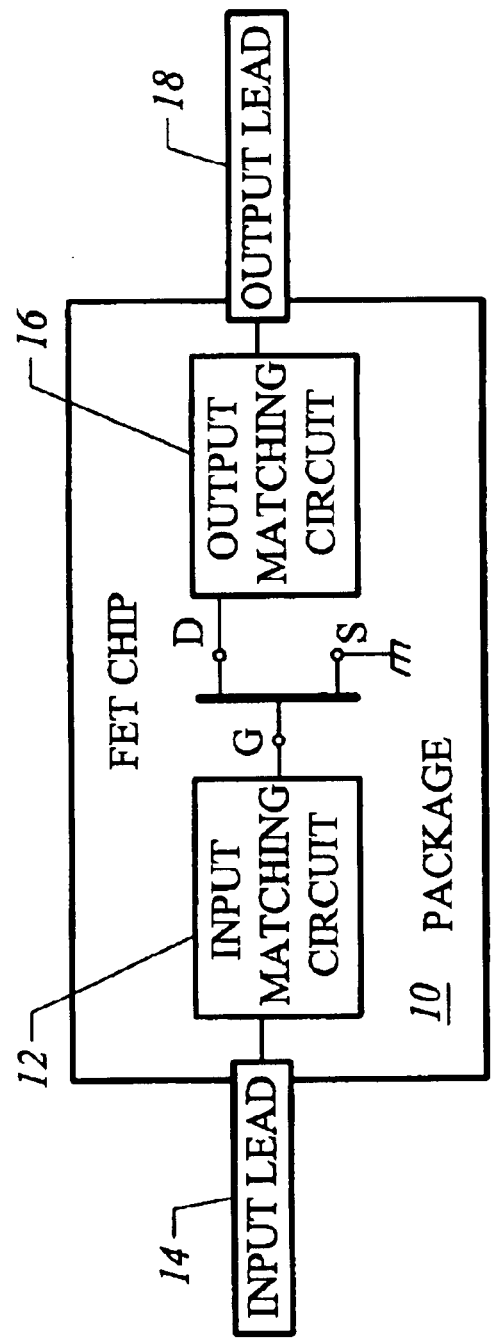
FIG. 1B is a functional block diagram of the packaged RF power transistor.
Figure 2:
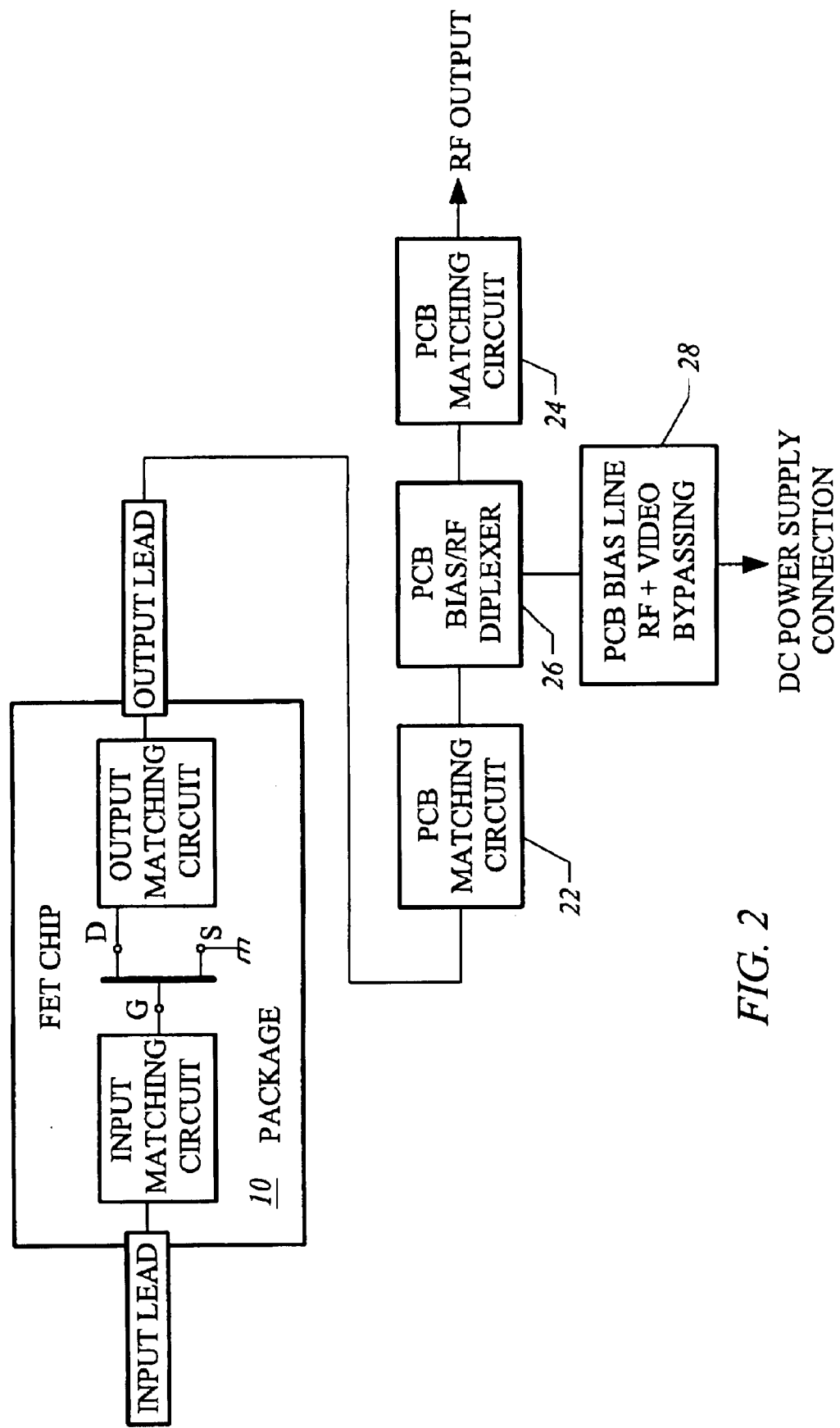
FIG. 2 is a functional block diagram of the packaged RF transistor of FIG. 1 mounted on a printed circuit board along with matching circuitry and bias line RF bypass circuitry for a DC power supply in accordance with prior art.
Figure 3:
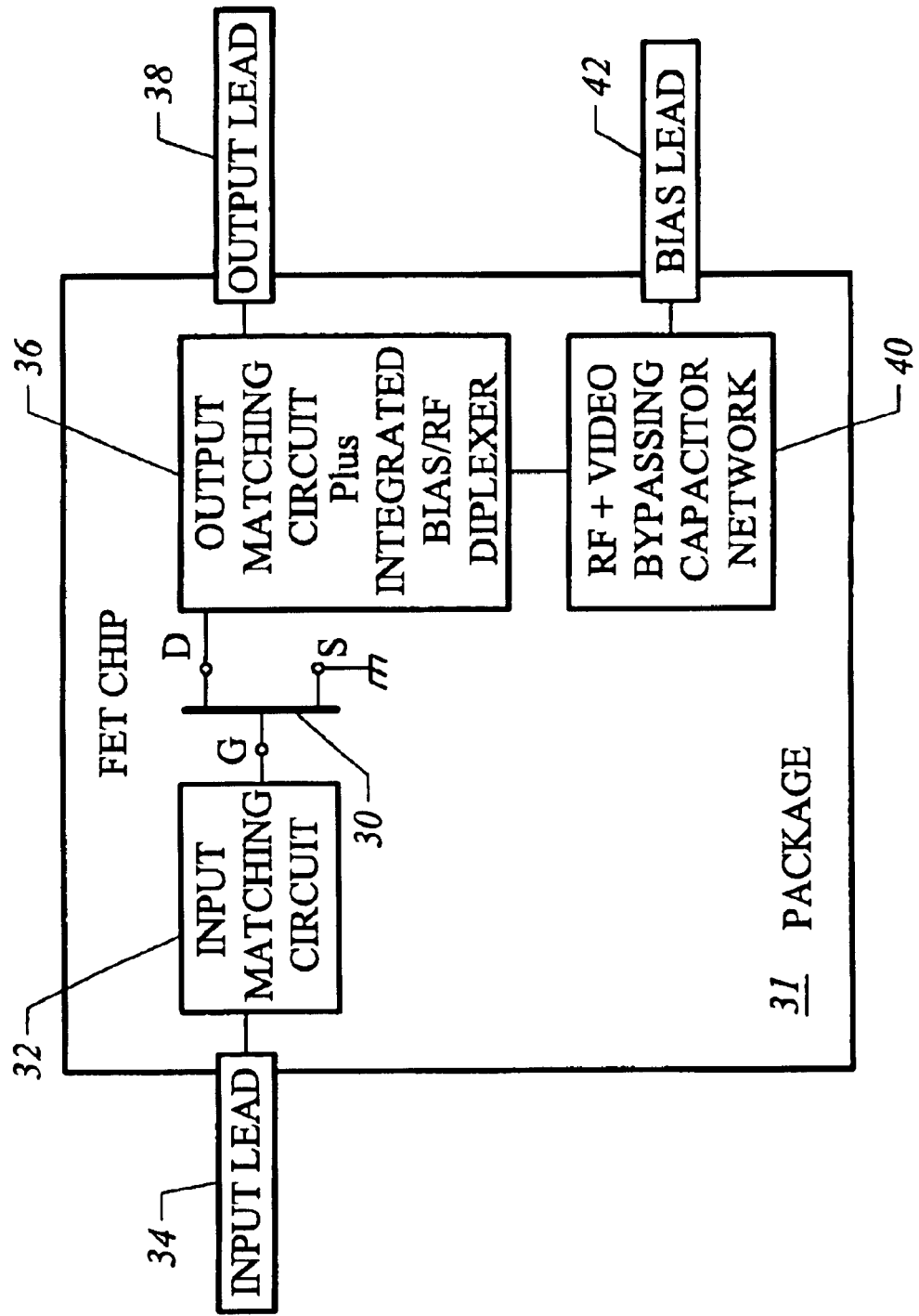
FIG. 3 is a functional block diagram of a packaged RF power transistor with matching and bypass circuitry in accordance with an embodiment of an invention.
Figure 4:
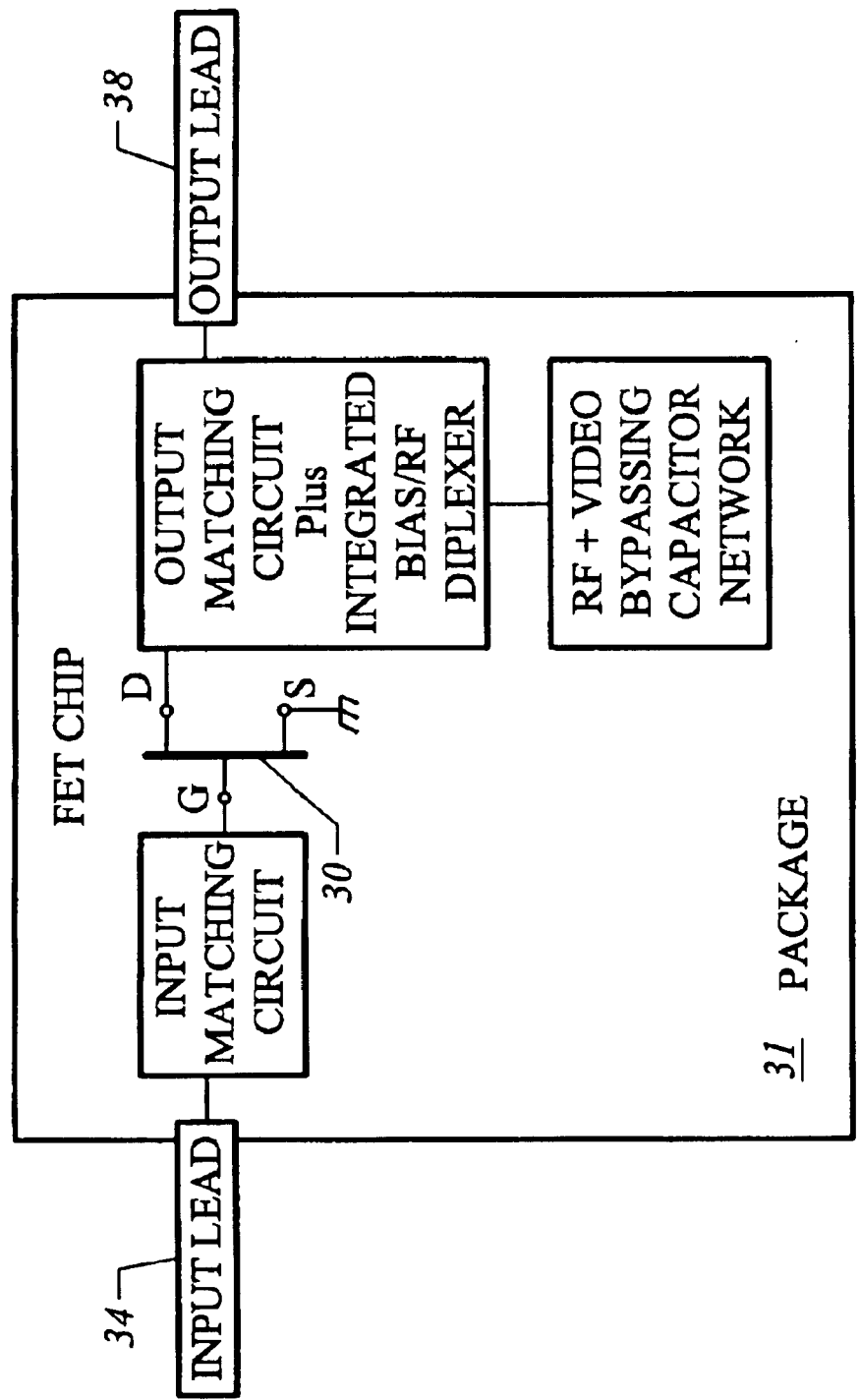
FIG. 4 is a functional block diagram of a packaged RF power transistor with matching and bypass circuitry in accordance with another embodiment of the invention.

FIGS. 3 and 4 are functional block diagrams of a packaged RF power transistor with matching and bypassing circuitry in accordance with two embodiments of the invention. Like elements in the two figures are the same. In FIG. 3 an RF power transistor 30 is mounted in package 31. An FET transistor is illustrated, but as noted above, the power transistor can be bipolar. Further, more than one transistor can be mounted in the package and connected in parallel. The gate of FET 30 is connected through input matching circuit 32 to input lead 34, as in the prior art, but the drain is connected through output matching circuit plus integrated bias/RF diplexer 36 to an output lead 38 and to a bias lead 42 which provides DC bias current to the transistor. In the prior art circuitry, illustrated in FIG. 2, circuitry 36 and 40 is mounted outside of the package on the printed circuit board at some distance from the transistor. As noted above, the provision of the output matching circuitry, bias/RF diplexer, and RF and video bypassing network within the package increases the power supply bypassing video bandwidth and increases the linearity of the power transistor circuit for wideband signals. The functional block diagram of FIG. 4 is similar to the circuit of FIG. 3 except that output lead 38 functions also as the bias lead.

Figure 5A:
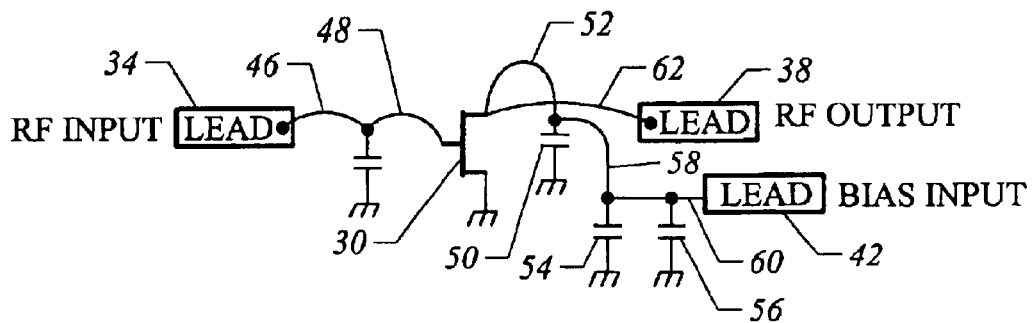
FIGS. 5A, 5B are physical and electrical schematics of a RF power transistor in accordance with one embodiment of the invention.
Figure 5B:
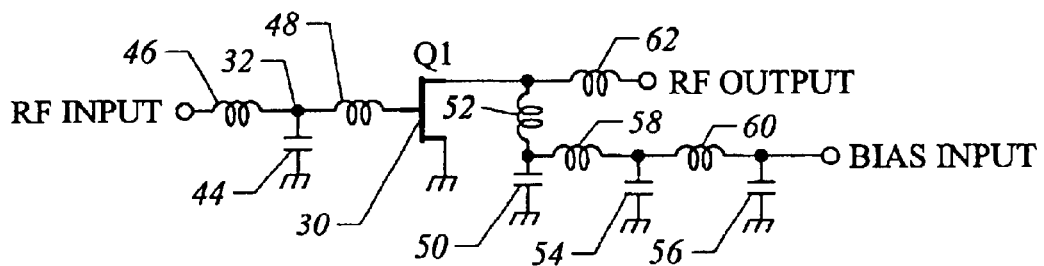

FIGS. 5A, 5B are physical and electrical schematics, respectively, of one embodiment of the invention in which wire bonding is employed as inductive elements and discrete multilayer capacitors are employed in the output matching and bypassing networks. In FIG. 5A the input matching circuit 32 of FIG. 3 comprises shunt capacitor 44 connected to the RF input 34 by wire bond 46 and to the base of transistor 30 by wire bond 48. The output matching and bypassing network comprises discrete multilayer capacitors 54, 56 connected in parallel with capacitor 50 (which possesses optimal properties at the carrier RF frequency) and which are connected to the drain of transistor 30 and bias input lead 42 by means of wire bonds 52, 58 and 60. In a typical embodiment, wire bond 52 comprises an inductance of particular value necessary to resonate with the transistor parasitic output capacitance. This small value supports optimum video bypassing. Similarly, RF output lead 38 is connected to the drain by means of wire bond 62.

FIG. 5B is an electrical schematic of the circuitry of FIG. 5A in which the wire bonds are illustrated as inductive elements in the lumped element schematic.

Figure 6A:
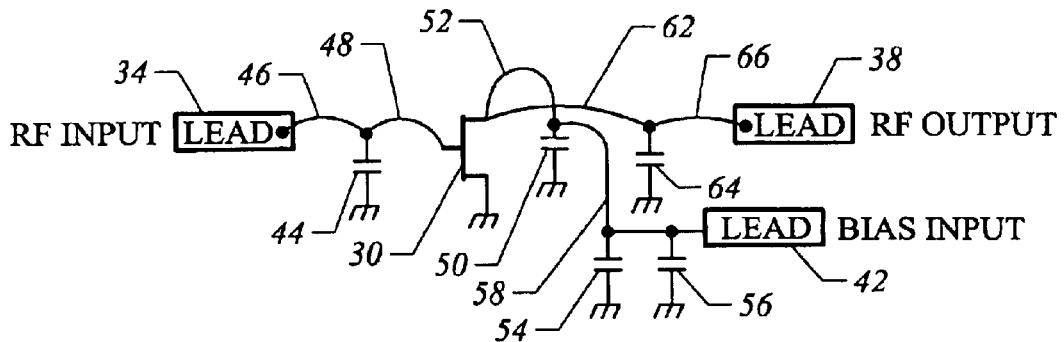
FIGS. 6A, 6B are physical and electrical schematics of a RF power transistor in accordance with another embodiment of the invention.
Figure 6B:
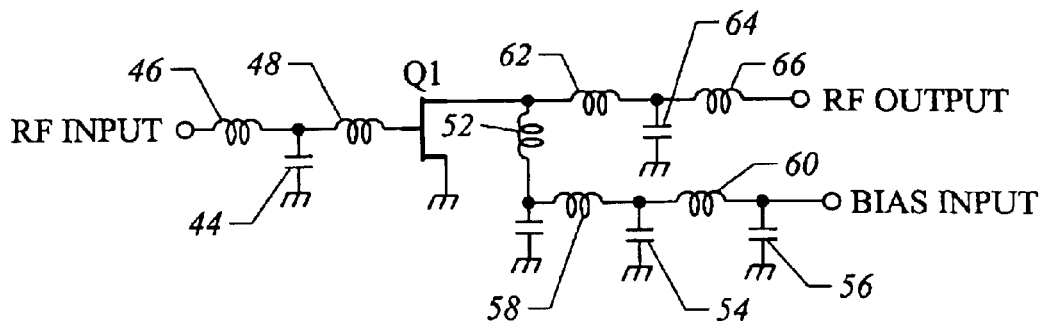

FIGS. 6A, 6B are physical and electrical schematics of another embodiment of the invention which is similar to the embodiment of FIGS. 5A, 5B with the addition of discrete capacitor 64 shunting RF output lead 38 and the drain of transistor 30 to ground and with wire bonds 62, 66 functioning as inductive elements in the output matching network.

Figure 7A:
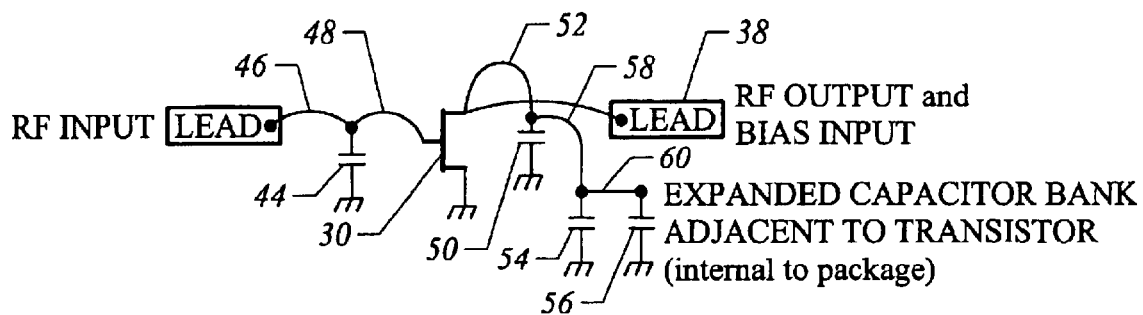
FIGS. 7A, 7B are physical and electrical schematics of a RF power transistor in accordance with another embodiment of the invention.
Figure 7B:
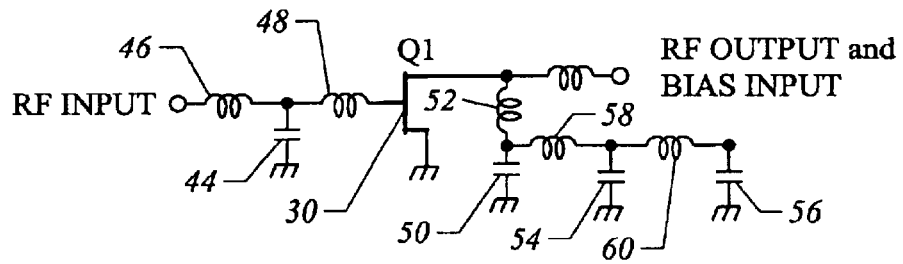
Figure 8A:
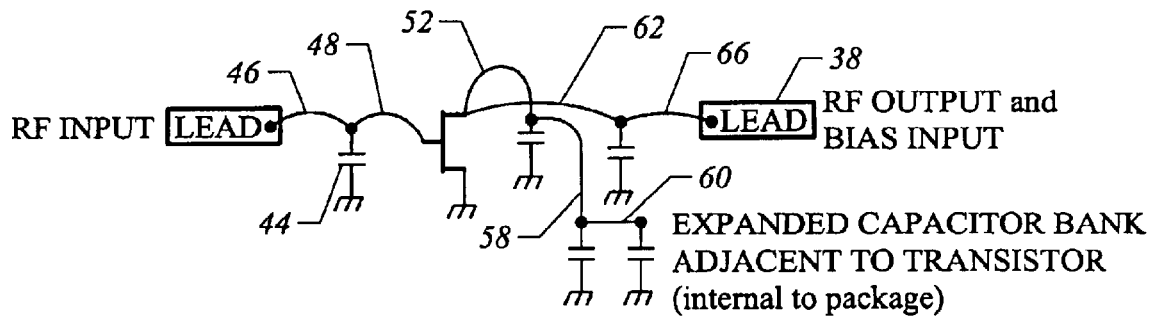
FIGS. 8A, 8B are physical and electrical schematics of a RF power transistor in accordance with another embodiment of the invention.
Figure 8B:
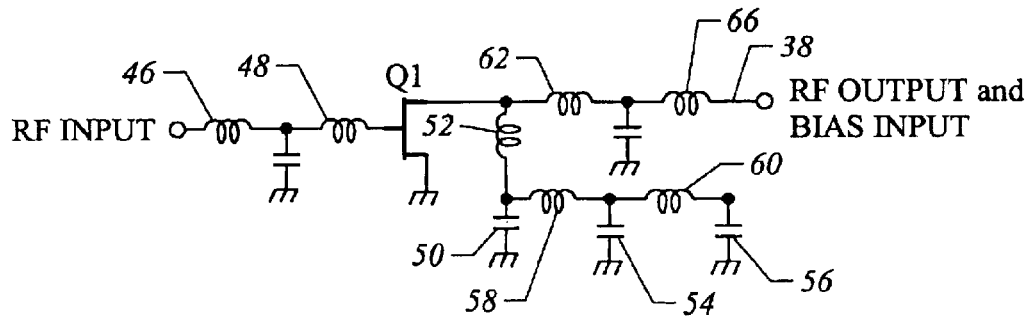

FIGS. 7A, 7B are physical and electrical schematics similar to the embodiments of FIGS. 5A, 5B but in which a separate bias input lead 42 is not employed. The RF output lead 38 functions also as the bias input. Similarly, FIGS. 8A, 8B correspond to the embodiment of FIGS. 6A, 6B but again a separate bias input is not provided and the RF output 38 functions as the bias input.

Figure 9:
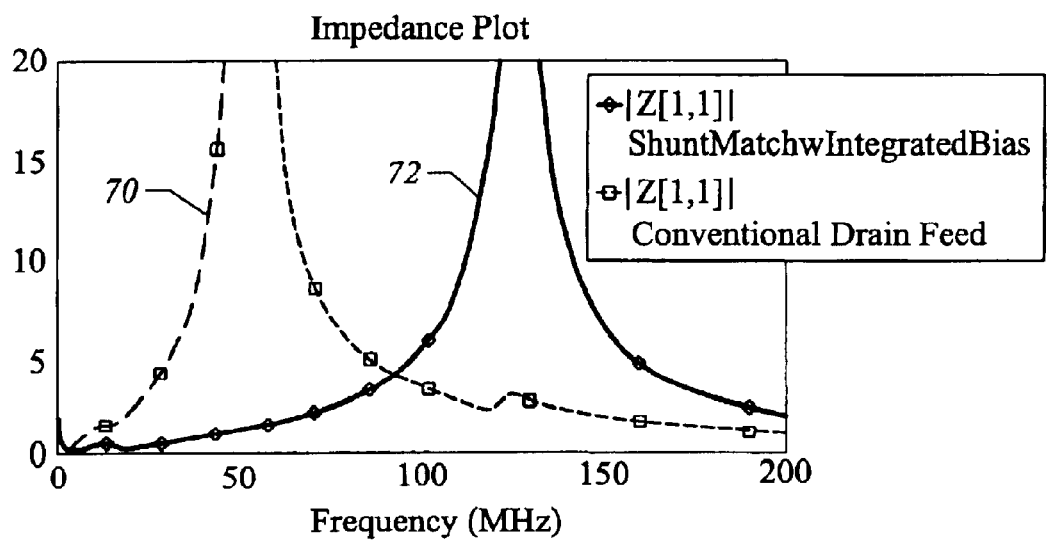
FIG. 9 is a plot of impedance versus frequency for a conventional RF power transistor and a RF power transistor in accordance with an embodiment of the invention.

FIG. 9 is a plot of impedance seen at the drain of the transistor at low frequencies versus operating frequency for a conventional device shown at 70 and for a device in accordance with the invention shown at 72. During normal power amplifier applications with digital communications signals, the currents flowing from the transistor contain RF (or microwave) frequency components as well as video frequency components. In an ideal situation the drain would be presented with a perfect power supply, or perfectly RF bypassed power supply, with zero impedance in the video frequency range. The common approach to connecting the high current power supply to the drain is to use either a conductor or a high impedance transmission line, sometimes chosen to be ¼ wavelength at the carrier frequency, with a capacitor bypassing array at the power supply end or connection. This array of capacitors is intended to approximate an ideal capacitor, however, actual physical bypass capacitors have inherent internal resistance and internal inductance. Therefore, the typical bypass capacitor array inserts a small capacitor with excellent characteristics at the carrier frequency nearest the transistor, and the larger capacitors (with optimal performance at lower video frequencies) are closer to the power supply. There is necessarily a finite distance between the bypass capacitors, and the short electrical connections also have inductive properties. With real physical capacitors, there are unavoidable resonances in the RF bypass capacitor array. While a low video frequency impedance (typically one ohm) is desired, it often increases to tens of ohms at resonant frequencies. The present invention increases the frequency of the first significant resonance, while not degrading the carrier frequency characteristics of the circuit, as illustrated in FIG. 9. Here the first resonance for the conventional circuitry is at about 50 MHz, while the circuitry in accordance with the invention increases the first resonance to approximately to 125 MHz. Since applications of power amplifiers to modern digital communications require very low bias circuit impedance to several tens of MHz, resonances in these circuits must be at frequencies of 100 MHz or higher since the impedance of these circuits shows significant increase at ¼ the first resonant frequency.

Figure 10:
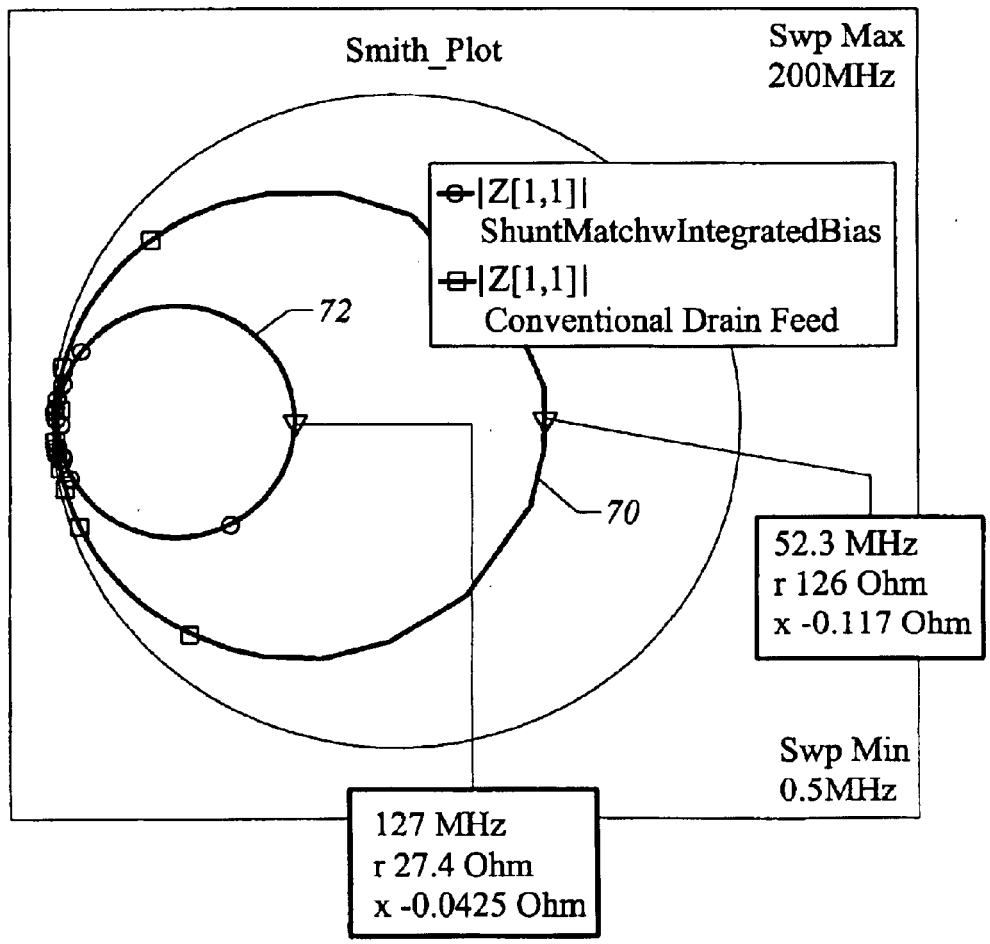
FIG. 10 illustrates the complex impedance on a Smith Chart for the transistors used in FIG. 9.

FIG. 10 shows the complex impedance of the conventional circuit versus the circuit in accordance with the invention on a Smith Chart graph. It is clear that the first resonance of the circuit model with all significant parasitic effects is 52 MHz for the conventional circuit and 127 MHz for the circuit in accordance with the invention. This improvement of over a factor of two is particularly significant for emerging and future digital communications applications where low resonances of conventional circuitry will introduce AM/PM distortion and AM/AM distortion in the output signal. These deleterious effects impair the ability of amplifier linearity enhancement technologies such as pre-distortion which are critical to these new systems. However, the present invention will make the RF power amplifiers practical in these new technologies.

Figure 11:
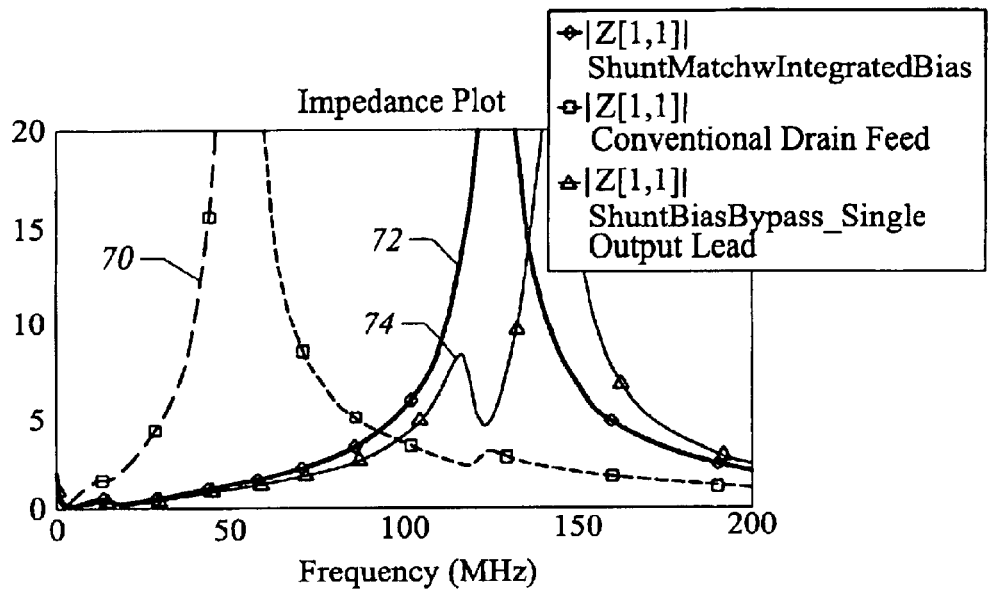
FIG. 11 is a plot of impedance versus frequency for a conventional RF power transistor and a RF power transistor in accordance with another embodiment of the invention.
Figure 12:
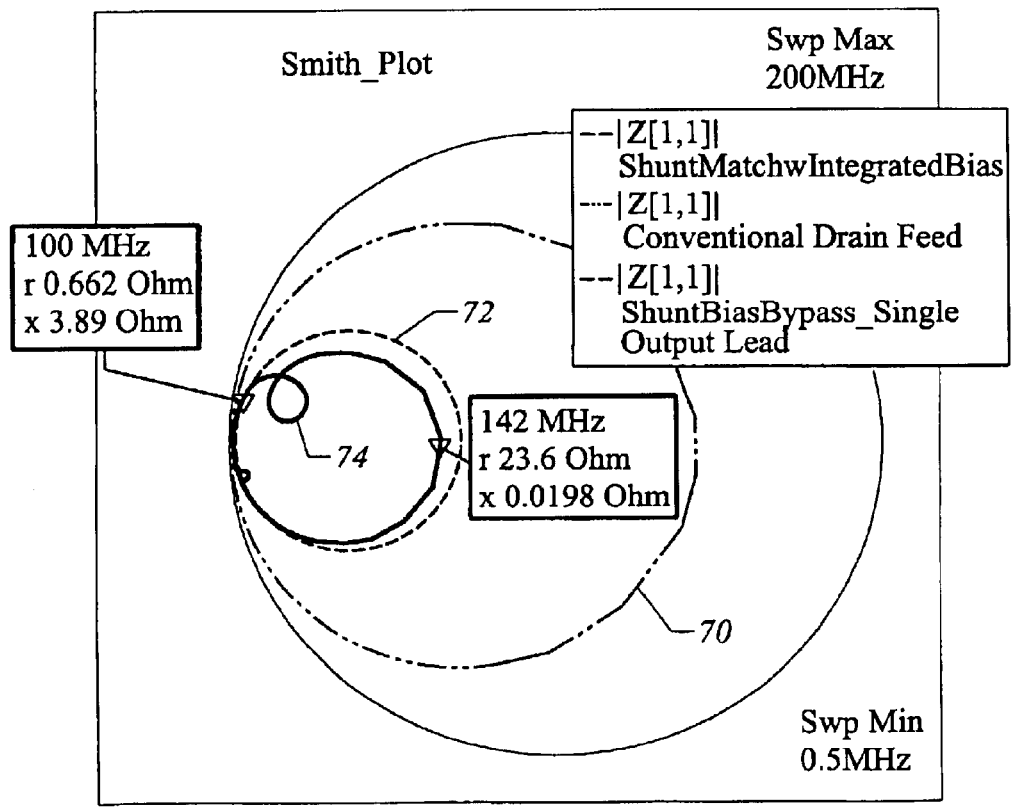
FIG. 12 illustrates the complex impedance on a Smith Chart for the transistors used in FIG. 11.

FIG. 11 is plot of impedance versus frequency for embodiments of RF power amplifiers where the bias lead is not a separate lead but is included with the RF output lead. Here there are two RF bypass capacitor networks (internal and external to the package) which can introduce an unwanted extra resonance. As shown in FIG. 11 an additional resonance 74 is introduced as a hump in the impedance plot 72 and as an extra circle in the Smith Chart representation in FIG. 12. From FIG. 12 it is seen that the extra resonance is introduced above 100 MHz, but this single lead alternative is superior to the conventional design which has the resonance at 52 MHz. Also, the impedance magnitude is reduced at lower frequencies because there is more combined bypass capacitance.

There have been shown several embodiments of RF power amplifiers in which a power supply video bypassing capacitor capacitor network is integrated with existing RF bypass capacitors that exist in a conventional power transistor output matching circuit. The total capacitance of the shunt resonant element is thereby increased by a factor of at least 10 relative to the prior art through use of the multiple capacitor network that functions at both RF and video frequencies. As noted, the invention is applicable to FET and bipolar transistors, both silicon and III–V material, and the invention is applicable to a single transistor or multiple transistors operating in parallel within a single package.

While the invention has been described with reference to specific embodiments, the description is illustrative of the invention and is not to be construed as limiting the invention. Various other applications and modifications may occur to those skilled in the art without departing from the true spirit and scope of the invention as defined by the appended claims.

What is claimed is:

1. A packaged RF power device comprising
   a) at least one transistor,
   b) an RF signal input lead coupled to the transistor,
   c) a ground terminal coupled to the transistor,
   d) an RF signal output lead coupled to the transistor,
   e) an output matching circuit and an RF and video bypassing circuit coupled to the RF signal output line, and
   f) a package for housing elements a) and e) with elements b), c), and d) extending from the package.

2. The packaged RF power device as defined by claim 1 and further including
   g) a bias lead for applying a DC bias voltage through the RF and video bypassing circuit to the transistor.

3. The packaged RF power device as defined by claim 2 wherein the RF and video bypassing circuit comprises at least one discrete capacitor and wire bonding coupling the discrete capacitor to the transistor, the wire bonding providing inductance in the RF bypassing circuit.

4. The packaged RF power device as defined by claim 3 wherein the output matching circuit includes an inductive element and a capacitive element serially connected to ground, with at least one discrete capacitor being connected by wire bonding in parallel with the first capacitive element.

5. The packaged RF power device as defined by claim 4 wherein the at least one discrete capacitor comprises a plurality of capacitors.

6. The packaged RF power device as defined by claim 1 wherein the RF and video bypassing circuit comprises at least one discrete capacitor and wire bonding coupling the discrete capacitor to the transistor, the wire bonding comprising inductance in the RF bypassing circuit.

7. The packaged RF power device as defined by claim 6 wherein the output matching circuit includes an inductive element and a capacitive element serially connected to ground, with at least one discrete capacitor being connected by wire bonding in parallel with the capacitive element.

8. The packaged RF power device as defined by claim 7 wherein the at least one discrete capacitor comprises a plurality of capacitors.

9. The packaged RF power device as defined by claim 1 wherein the at least one transistor comprises a FET.

10. The packaged RF power device as defined by claim 1 wherein the at least one transistor comprises a bipolar transistor.

11. The packaged RF power device as defined by claim 1 wherein the at least one transistor comprises a plurality of transistors.

12. A method of improving linearity in a wideband RF power transistor device comprising the steps of:

a) providing in a housing at least one RF power transistor, b) providing an input lead and an output lead extending through the housing and electrically coupled to the transistor, c) providing in the housing an output matching circuit coupled to the output lead, and d) providing in the housing a RF and video bypass circuit connected with the output matching circuit, the RF and video bypass circuit preventing RF and video current from flowing to a DC power supply when supplying DC power to the transistor.

13. The method as defined by claim 12 and further including the step of e) providing a bias lead extending through the housing for providing DC power to the transistor, the RF and video bypass circuit being connected to the bias lead.

14. The method as defined by claim 13 wherein the RF and video bypass circuit of step d) comprises at least one discrete capacitor and wire bonding coupling the discrete capacitor to the transistor, the wire bonding providing inductance in the RF bypass circuit.

15. The method as defined by claim 14 wherein the output matching circuit of step c) includes an inductive element and a capacitive element serially connected to ground, with at least one discrete capacitor being connected by wire bonding in parallel with the first capacitive element.

16. The method as defined by claim 15 wherein the at least one discrete capacitor of step d) comprises a plurality of capacitors.

17. The method as defined by claim 12 wherein the RF bypass circuit of step d) comprises at least one discrete capacitor and wire bonding coupling the discrete capacitor to the transistor, the wire bonding providing inductance in the RF bypass circuit.

18. The method as defined by claim 17 wherein the output matching circuit of step c) includes an inductive element and a capacitive element serially connected to ground, with at least one discrete capacitor being connected by wire bonding in parallel with the capacitive element.

19. The method as defined by claim 18 wherein the at least one discrete capacitor of step d) comprises a plurality of discrete capacitors.

* * * * *